US008547319B2

(12) United States Patent
Hwang et al.

(10) Patent No.: US 8,547,319 B2
(45) Date of Patent: Oct. 1, 2013

(54) DISPLAY APPARATUS INCLUDING A GATE DRIVER THAT HAS A PLURALITY OF STAGES AND METHOD FOR DRIVING THE DISPLAY APPARATUS

(75) Inventors: In-Jae Hwang, Cheonan-si (KR); Sang-Moon Moh, Cheonan-si (KR); Yu-Han Bae, Seoul (KR)

(73) Assignee: Samsung Display Co., Ltd. (KR)

( * ) Notice: Subject to any disclaimer, the term of this patent is extended or adjusted under 35 U.S.C. 154(b) by 966 days.

(21) Appl. No.: 12/112,918

(22) Filed: Apr. 30, 2008

(65) Prior Publication Data

US 2009/0273552 A1 Nov. 5, 2009

(51) Int. Cl.
*G09G 3/36* (2006.01)
*G09G 5/00* (2006.01)
*G06F 3/038* (2013.01)
*G11C 19/00* (2006.01)

(52) U.S. Cl.
USPC .............................. 345/100; 345/204; 377/64

(58) Field of Classification Search
USPC ........................................... 345/84–107, 204
See application file for complete search history.

(56) References Cited

U.S. PATENT DOCUMENTS

2003/0174118 A1* 9/2003 Sato et al. .................... 345/100
2007/0052658 A1* 3/2007 Kim .............................. 345/100
2009/0267924 A1* 10/2009 Shimizu et al. ............... 345/204

FOREIGN PATENT DOCUMENTS

WO WO 2007/083410 * 7/2007

* cited by examiner

*Primary Examiner* — Bipin Shalwala
*Assistant Examiner* — Ryan A Lubit
(74) *Attorney, Agent, or Firm* — Innovation Counsel LLP

(57) ABSTRACT

A display apparatus includes a panel part, a data driver, and a gate driver. The panel part includes a plurality of gate lines, a plurality of data lines, and a plurality of pixels each of which is connected to one gate line of the gate lines and one data line of the data lines. The data driver receives image data and outputs a data signal to the data lines. The gate driver part is disposed on the panel part and applies gate signals to the gate lines. Periods of clock signals controlling the level of the gate signals are different from that of the gate signals. Thus, power consumption of the display apparatus is substantially effectively reduced.

21 Claims, 5 Drawing Sheets

DISPLAY APPARATUS INCLUDING A GATE DRIVER THAT HAS A PLURALITY OF STAGES AND METHOD FOR DRIVING THE DISPLAY APPARATUS

BACKGROUND OF THE INVENTION

1. Field of the Invention

The present invention relates to a display apparatus and more particularly, to a display apparatus having substantially reduced power consumption.

2. Description of the Related Art

In general, a liquid crystal display is widely used as an alternative to a cathode ray tube in an image display device. The liquid crystal display includes two substrates spaced apart from each other at a predetermined distance and having liquid crystals disposed therebetween. In the liquid crystal display, an electric field is applied to the liquid crystals to control an intensity of an electric field between the two substrates to adjust an amount of light passing therethrough, thereby displaying a desired image.

A size of the liquid crystal display must be increased to display an increased amount of image information. A liquid crystal display consumes much power as the size of the liquid crystal display increases.

BRIEF SUMMARY OF THE INVENTION

The present invention provides a display apparatus having substantially reduced power consumption.

In one embodiment of the present invention, a display apparatus includes a panel part which has a plurality of gate lines and a plurality of data lines and a plurality of pixels. Each pixel is connected to one gate line of the plurality of gate lines, and is commonly connected to one data line of the plurality of data lines. The display apparatus also includes a data driver which receives image data and outputs a data signal to the plurality of data lines and a gate driver part disposed on the panel part and which applies a plurality of gate signals to the plurality of gate lines, wherein periods of the plurality of clock signals controlling the level of the gate signal is different from that of the gate signal.

In another embodiment of the invention a method of driving a display apparatus includes supplying a gate-on signal to a plurality of gate lines, and supplying a data signal to a plurality of data lines wherein the periods of the plurality of clock signals controlling the level of the gate-on signal is different from that of the gate-on signal, and a gate driver part applying a plurality of gate-on signals is disposed on the panel.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
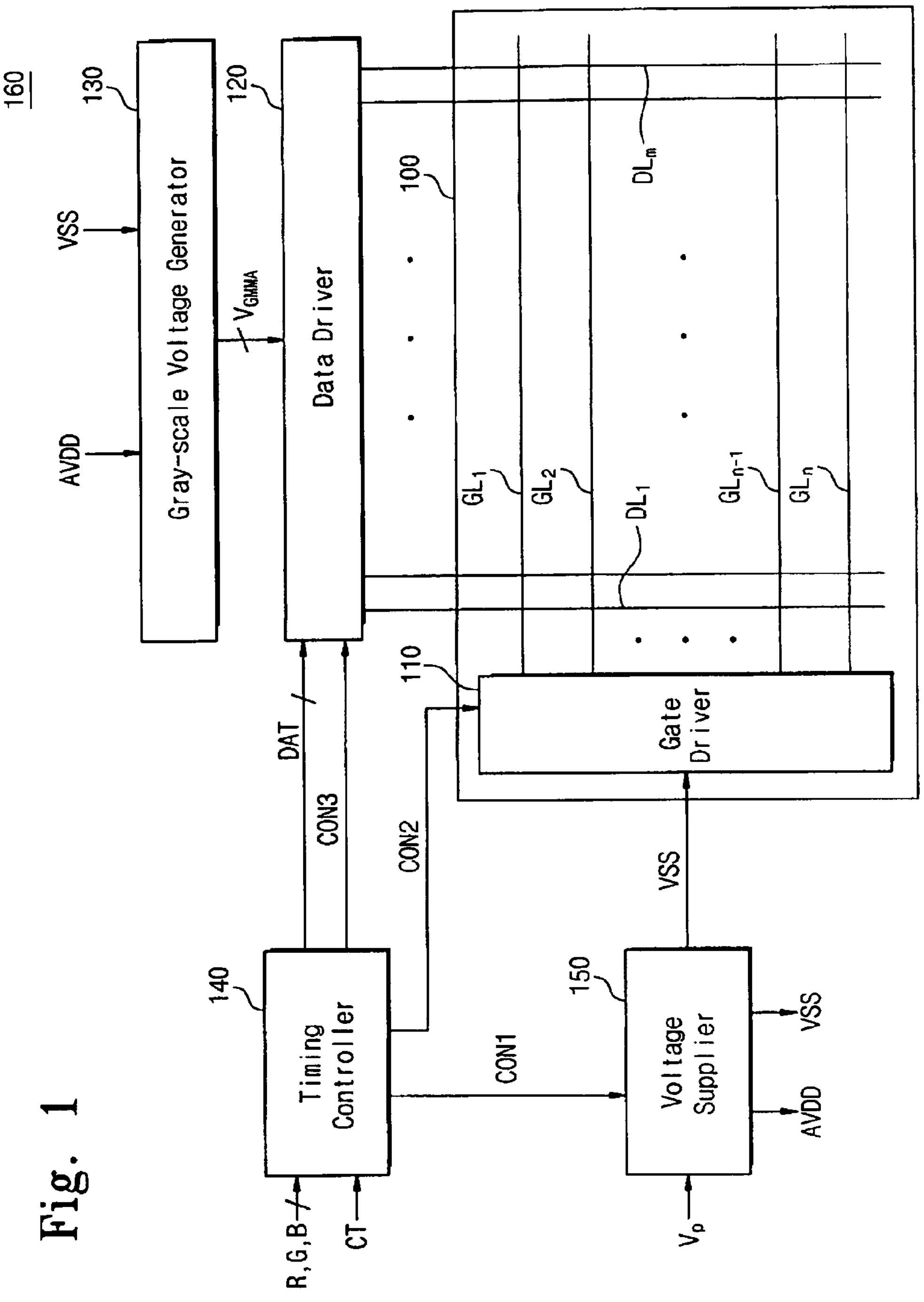
FIG. 1 is a block diagram of a liquid crystal display ("LCD") according to an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be explained in further detail with reference to the accompanying drawings.

FIG. 1 is a block diagram of the liquid crystal display according to an exemplary embodiment of the present invention.

Referring to FIG. 1, a liquid crystal display ("LCD") 160 includes a display panel 100, a gate driver 110, a data driver 120, a gray-scale voltage generator 130, a timing controller 140 and a voltage supplier 150.

The display panel 100 includes a plurality of gate lines including gate lines $GL_1$, $GL_2$, . . . , $GL_{n-1}$, and $GL_n$, a plurality of data lines including data lines $DL_1$, . . . , $DL_m$, and a plurality of pixels (not shown). Each pixel of the plurality of pixels are connected to the gate line and data line, as described in further detail below with respect to FIG. 2.

The timing controller 140 receives image signals R, G and B from a graphics controller (not shown) and outputs a first control signal CON1, a second control signal CON2, a third control signal CON3 and an image signal DAT based on a timing control signal CT. The voltage supplier 150 receives a power voltage $V_p$ from an outside source (not shown) and outputs a first driving voltage AVDD and a second driving voltage VSS based on the first control signal CON1. The first driving voltage AVDD is applied to the gray-scale voltage generator 130, and the second driving voltage VSS is applied to the gray-scale voltage generator 130 and the gate driver 110, as shown in FIG. 1.

The gate driver 110 receives the second driving voltage VSS from the voltage supplier 150 and the second control signal CON2 from the timing controller 140 to sequentially output a plurality of gate signals. In an exemplary embodiment, the gate driver 110 is directly formed on an end portion of the display panel 100 through a thin film process and is electrically connected to the gate lines $GL_1$, $GL_2$, . . . , $GL_{n-1}$, and $GL_n$ disposed on the display panel 100. Thus, the gate driver 110 sequentially applies the gate signals to the gate lines $GL_1$, $GL_2$, . . . , $GL_{n-1}$, and $GL_n$, as described in further detail below.

The gray-scale voltage generator 130 has a resistor-string structure in which individual resistors of a plurality of resistors are connected in serial, e.g., in electrical series with each other. The first driving voltage AVDD and the second driving voltage VSS from the voltage supplier 150 are applied to opposite end terminals of the resistor-string structure. In an exemplary embodiment, the second driving voltage VSS is a ground voltage, but alternative exemplary embodiments are not limited thereto. The gray-scale voltage generator 130 outputs gray scale voltages $V_{GMMA}$ of a plurality of gray-scale voltages $V_{GMMA}$ through output terminals, each of which is connected to a corresponding connection node between the individual resistors of the resistor-string structure. The gray-scale voltage generator 130 is not limited to the above-described configuration. Rather, alternative exemplary embodiments of the present invention may include various configurations which output the gray-scale voltages $V_{GMMA}$ of the plurality of gray-scale voltages $V_{GMMA}$.

Still referring to FIG. 1, the data driver 120 receives the image signal DAT and the third control signal CON3 from the timing controller 140 and receives the gray-scale voltages $V_{GMMA}$ from the gray-scale voltage generator 130. Based on the third control signal CON3, the data driver 120 converts the image signal DAT, which is a digital signal, to an analog data voltage based on the gray-scale voltages $V_{GMMA}$. The data driver 120 is electrically connected to the data lines $DL_1$-$DL_m$ disposed on the display panel 100. Accordingly, the analog data voltage output from the data driver 120 is applied to the data lines $DL_1$-$DL_m$.

Figure 2:
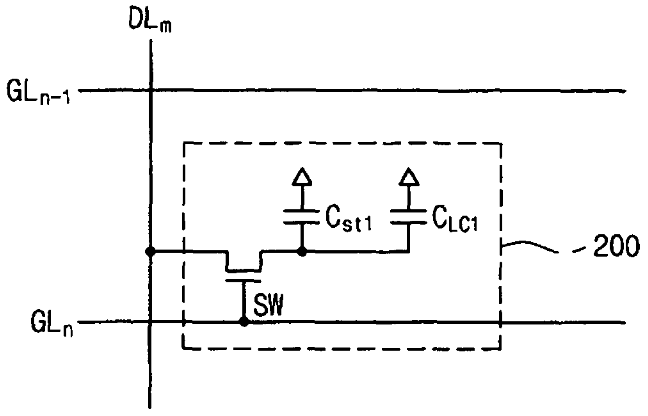
FIG. 2 is an equivalent schematic circuit diagram of a pixel of the LCD according to the exemplary embodiment of the present invention shown in FIG. 1.

FIG. 2 is an equivalent schematic circuit diagram of a pixel of the LCD according to the exemplary embodiment of the present invention shown in FIG. 1.

Referring to FIG. 2, a pixel includes a switching device SW, a storage capacitor $C_{st}$, and a liquid crystal capacitor $C_{LC}$. The switching device SW includes a control terminal connected to an n-1th numbered gate line $GL_{n-1}$, an input terminal connected to an m-th data line $DL_m$, and an output terminal connected to the liquid crystal capacitor $C_{LC}$ and to the first storage capacitor $C_{st}$. The storage capacitor $C_{st}$ maintains an electric charge charged into the liquid crystal capacitor $C_{LC}$. More specifically, when a gate signal is applied to the n-th numbered gate line $GL_n$ connected to the control terminal of the switching device SW, the liquid crystal capacitor $C_{LC}$ is charged with a data voltage applied to the m-th data line $DL_m$ connected to the input terminal of the switching device SW. In an exemplary embodiment, the gate signal is defined as a signal which has a voltage level sufficient to turn on the switching device SW. The data voltage charged in the liquid crystal capacitor $C_{LC}$ is maintained by the storage capacitor $C_{st}$ during one frame.

Figure 3:
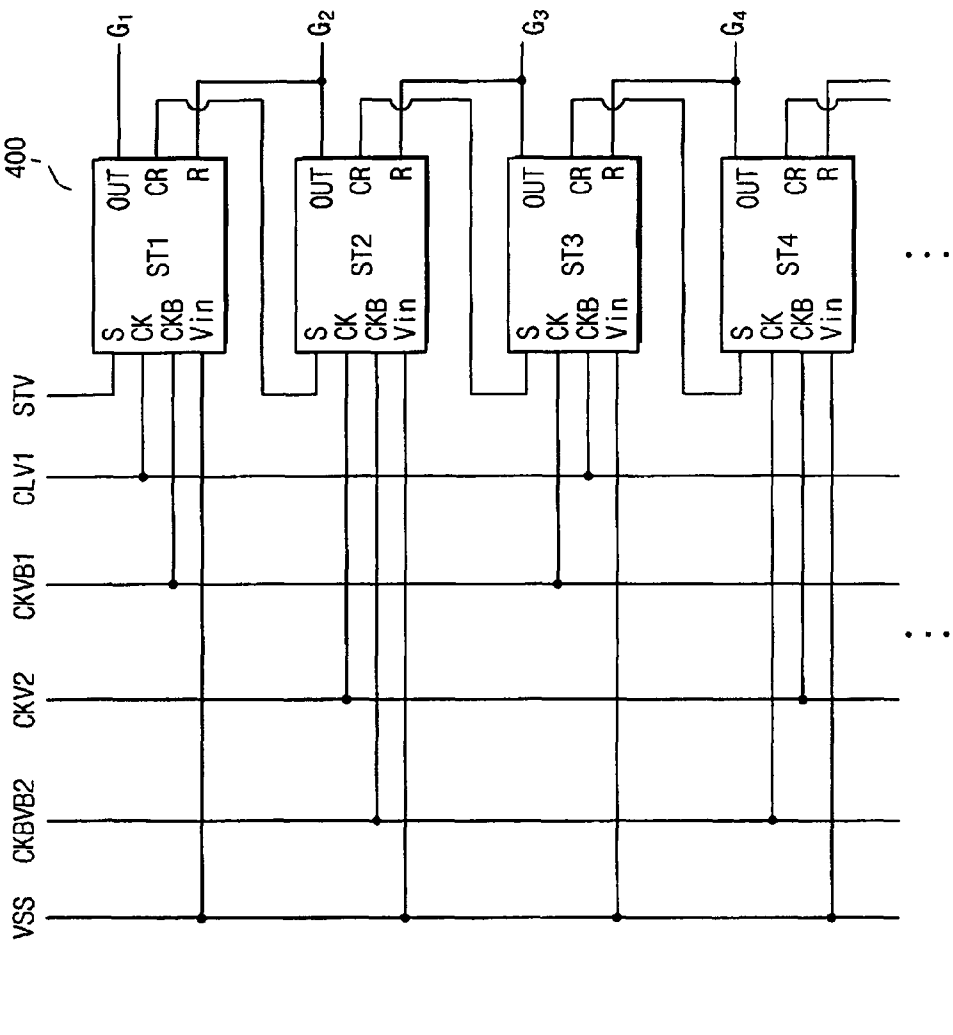
FIG. 3 is a block diagram of a gate driver of the LCD according to the exemplary embodiment of the present invention shown in FIG. 1.

FIG. 3 is a block diagram of a gate driver of the LCD according to the exemplary embodiment of the present invention shown in FIG. 1.

The gate driver 110 (FIG. 1) according to an exemplary embodiment includes a plurality of stages, including a first stage ST1, a second stage ST2, a third stage ST3 and a fourth stage ST4, as shown in FIG. 3. Each of the first stage ST1, the second stage ST2, the third stage ST3 and the fourth stage ST4 provides a gate signal to the gate lines $G_1$, $G_2$, $G_3$, and $G_4$.

Each of the first stage ST1, the second stage ST2, the third stage ST3 and the fourth stage ST4 includes a set terminal S, a gate voltage terminal Vin, a first clock terminal CK, a second clock terminal CKB, a reset terminal R, a gate output terminal OUT and a carry output terminal CR.

Each of the stages receives a carry signal output from a carry output terminal CR of an adjacent previous stage through the set terminal S thereof and receives a gate signal output from the gate output terminal OUT of an adjacent subsequent stage through the reset terminal R thereof. However, the first stage ST1 receives a scanning start signal STV through the set terminal S thereof. Also, each odd-numbered stage receives a first clock signal CKV1 and a second clock signal CKVB1 alternatively applied to the first clock terminal CK and the second clock terminal CKB, respectively, and receives a gate-off voltage VSS through the gate voltage terminal Vin thereof. More specifically, when the first clock signal CKV1 is applied to the first clock terminal CK, the second clock signal CKVB1 is applied to the second clock terminal CKB of a given odd-numbered stage. Further, the first clock signal CKV1 and the second clock signal CKVB1 are alternately applied to the first clock terminal CK and the second clock terminal CKB of each consecutive odd-numbered stage, as shown in FIG. 3. A phase difference of the first clock signal CKV1 and the second clock signal CKVB1 is 180 degrees.

Similarly, each even-numbered stage, e.g., the second stage ST2 and the fourth stage ST4 receives a third clock signal CKV2 and a fourth clock signal CKVB2 alternatively applied to the first clock terminal CK and the second clock terminal CKB, respectively, and receives the gate-off voltage VSS through the gate voltage terminal Vin thereof. Specifically, when the third clock signal CKV2 is applied to the first clock terminal CK, the fourth clock signal CKVB2 is applied to the second clock terminal CKB of a given even-numbered stage. Thus the third clock signal CKV2 and the fourth clock signal CKVB2 are alternately applied to the first clock terminal CK and the second clock terminal CKB, respectively, of each even-numbered stage. A phase difference of the third clock signal CKV2 and the fourth clock signal CKVB2 is 180 degrees. A phase difference of the first clock signal CKV1 and the second clock signal CKV2 is 90 degrees. And a phase difference of the third clock signal CKVB1 and the fourth clock signal CKV2 is 90 degrees.

The first to fourth clock signals CKV1, CKVB1, CKV2 and CKVB2, respectively, have a high voltage level substantially equal to a voltage level which turns on a switching device of the pixel of the LCD 160, as well as a low voltage level substantially equal to a voltage level which turns off the switching device thereof. The scanning start signal STV, and the first to fourth clock signals CKV1, CKVB1, CKV2, and CKVB2, respectively, are included in the second control signal CON2 output from the timing controller 140 to the gate driver 110 (FIG. 1), but alternative exemplary embodiments are not limited thereto.

Figure 4:
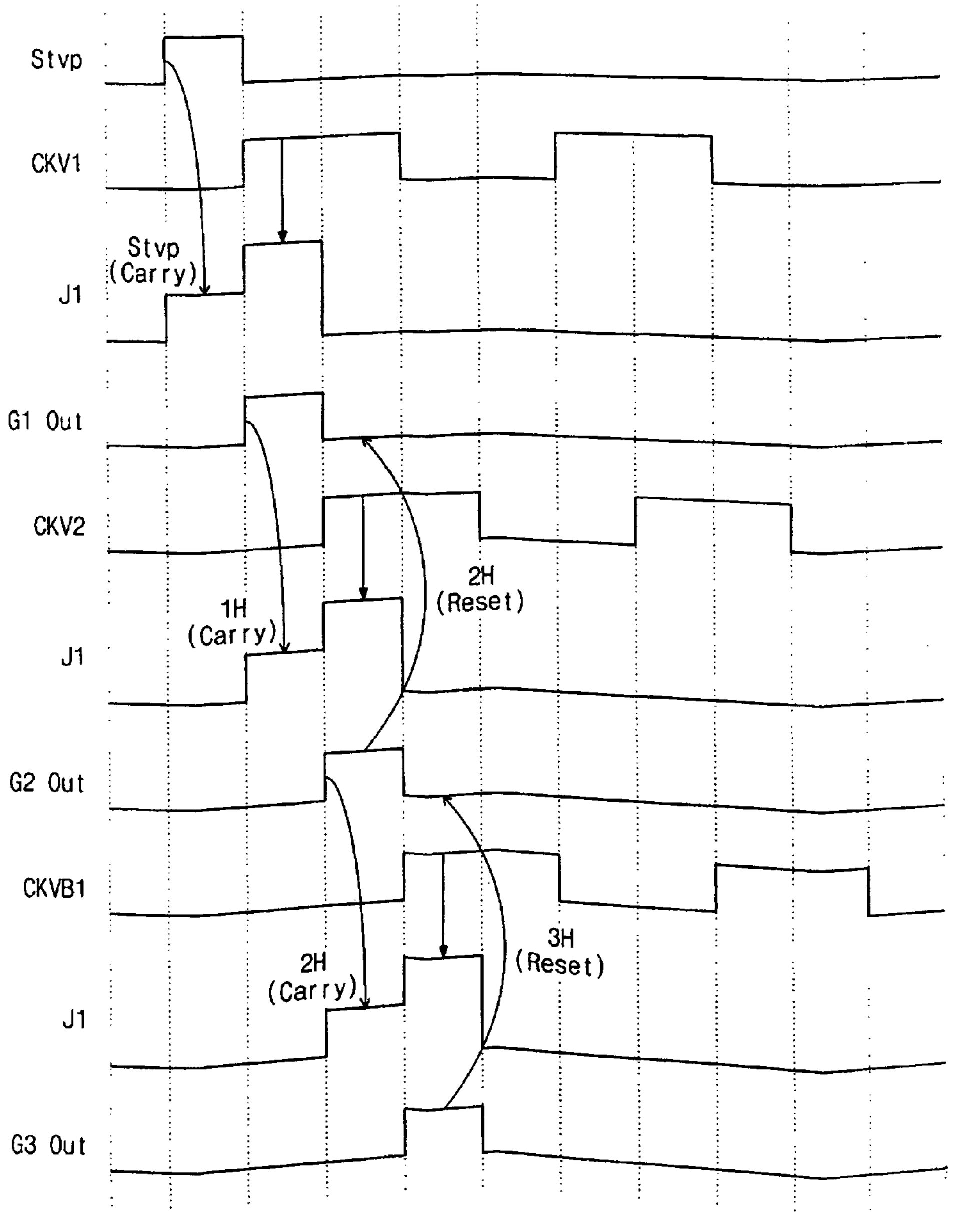
FIG. 4 is a waveform of a gate signal and control signal according to the exemplary embodiment of the present invention.

FIG. 4 is a waveform of a gate signal and a second control signal according to the exemplary embodiment of the present invention. This figure will be further described in conjunction with the description of FIG. 5.

Figure 5:
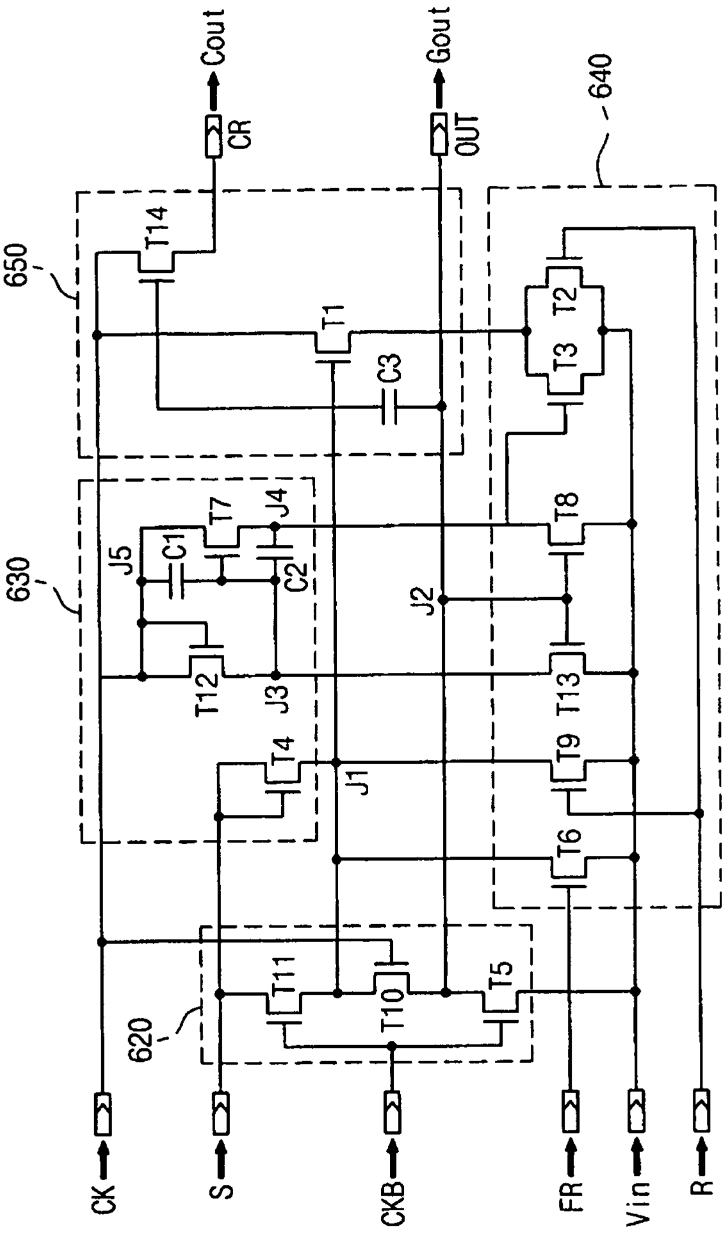
FIG. 5 is a schematic circuit diagram of a single stage of the gate driver according to the exemplary embodiment of the present invention shown in FIG. 3.

FIG. 5 is a schematic circuit diagram of a single stage of the gate driver according to the exemplary embodiment of the present invention shown in FIG. 3.

The stages of the gate driver 110 (FIG. 1), e.g., the first stage ST1, the second stage ST2, the third stage ST3 and the fourth stage ST4 (FIG. 3), each have substantially the same configuration and function, as described in greater detail above. Therefore only one stage is illustrated in further detail in FIG. 5. Specifically only odd-numbered single stages will now be described in further detail, in order to avoid redundancy.

Referring to FIG. 5, a single stage includes an input part 620, a pull-up driving part 630, a pull-down driving part 640 and an output part 650. The single stage further includes first to fourteenth transistors T1 to T14, respectively, first to third capacitors C1 to C3, respectively, and first to fourth nodes J1 to J4, respectively.

More specifically, the input part 620 includes the fifth, tenth and eleventh transistors T5, T10 and T11, respectively, connected in series with each other between a set terminal S of the single stage and a gate voltage terminal Vin of the single stage. Gates of the fifth and eleventh transistors T5 and T11, respectively, are connected to a second clock terminal CKB of the single stage, and a gate of the tenth transistor T10 is connected to a first clock terminal CK of the single stage. A contact point between the eleventh transistor T11 and the tenth transistor T10 is connected to the first node J1, and a contact point between the tenth transistor T10 and the fifth transistor T5 is connected to the second node J2, as shown in FIG. 7.

The pull-up driving part 630 includes the fourth transistor T4 connected between the set terminal S of the single stage and the first node J1, the twelfth transistor T12 connected between the first clock terminal CK and the third node J3, and the seventh transistor T7 connected between the first clock terminal CK and the fourth node J4. The fourth transistor T4 includes a gate and a drain commonly connected to the set terminal S, and a source connected to the first node J1. The twelfth transistor T12 includes a gate and a drain commonly connected to the first clock terminal CK, e.g., the fifth node J5, and a source connected to the third node J3. The seventh transistor T7 includes a gate connected to the third node J3 and connected to the first clock terminal CK, e.g., the fifth node J5, through the first capacitor C1, a drain connected to the first clock terminal CK, and a source connected to the fourth node J4. The pull-up driving part 630 further includes the second capacitor C2 connected between the third node J3 and the fourth node J4.

The pull-down driving part 640 includes the sixth, ninth, thirteenth, eighth, third and second transistors T6, T9, T13, T8, T3 and T2, respectively, each receiving the gate-off voltage VSS to a source thereof through the gate voltage terminal Vin of the single stage. The sixth transistor T6 and the ninth transistor T9 output the gate-off voltage Vss through a drain thereof to the first node J1, the thirteenth transistor T13 outputs the gate-off voltage Vss through a drain thereof to the third node J3, the eighth transistor T8 outputs the gate-off voltage Vss through a drain thereof to the fourth node J4, and the third transistor T3 and the second transistor T2 output the gate-off voltage Vss through a drain thereof to the second node J2. Further, the sixth transistor T6 includes a gate connected to a frame reset terminal FR of the single stage and a drain connected to the first node J1, and the ninth transistor T9 includes a gate connected to a reset terminal R of the single stage and a drain connected to the first node J1. Gates of the thirteenth and eighth transistors T13 and T8, respectively, are commonly connected to the second node J2, and drains of the thirteenth and eighth transistors T13 and T8, respectively, are connected to the third node J3 and the fourth node J4, respectively. The third transistor T3 includes a gate connected to the fourth node J4 and a drain connected to the second node J2. The second transistor T2 includes a gate connected to the reset terminal R of the single stage and a drain connected to the second node J2.

The output part 650 includes the first and fourteenth transistors T1 and T14, respectively. The first transistor T1 includes a gate connected to the first node J1, a drain connected to the first clock terminal CK of the single stage, and a source connected to an output terminal OUT of the single stage, through which a gate signal Gout is output, and to the second node J2. The fourteenth transistor T14 includes a gate connected to the first node J1, a drain connected to the first clock terminal CK of the single stage, and a source connected to a carry terminal CR of the single stage, through which a carry signal Cout is output. The output part 650 further includes the third capacitor C3 connected between the first node J1 and the second node J2.

In an exemplary embodiment, each of the first to fourteenth transistors T1 to T14, respectively, is an NMOS transistor, as shown in FIG. 7, but alternative exemplary embodiments are not limited thereto. For example, any or all of the first to fourteenth transistors T1 to T14, respectively, may be a PMOS transistor. Further, the first, second and third capacitors C1, C2 and C3, respectively, may be implemented as a parasitic capacitance formed between a gate, drain, and/or source of one or more of the first to fourteenth transistors T1 to T14, respectively, but alternative exemplary embodiments are not limited to the foregoing description.

An operation of the single stage will now be described in further detail with respect to FIG. 5. For purposes of the description, a voltage corresponding to a high level of a clock signal applied to the first clock terminal CK of the single stage, e.g., the first clock signal CKV1 (FIG. 4), has a level substantially the same as a level of voltage which turns on switching devices of the LCD 160, and will hereinafter be referred to as a high voltage. Further, a voltage corresponding to a low level of a clock signal applied to the second clock terminal CKB of the single stage, e.g., the second clock signal CKVB1 (FIG. 4), has a level substantially equal to a level of the gate-off voltage VSS, and will hereinafter be referred to as a low voltage.

The single stage of the gate driver receives control signals and provides gate signals. The carry signal Cout is applied to the single signal stage is in a logic high and a first clock signal that is applied to the first single stage is in a logic low and a second clock signal CKVB1 that is applied to the first single stage is in a logic high. But the first stage of the gate driver receives the scanning start signal STV instead of the carry signal Cout.

When a carry signal Cout is applied to the set terminal S of a current single stage and the second clock signal CKVB1 applied to the second clock terminal CKB of the current single stage are in a logic high state, the eleventh, fifth, and fourth transistors T11, T5 and T4, respectively, are turned on. As a result, the eleventh and fourth transistors T11 and T4, respectively, provide the high voltage to the first node J1 when a scanning start signal and first clock signal is in a low state as illustrated in the waveform of FIG. 4, while the fifth transistor T5 provides the low voltage to the second node J2. Therefore, the first and fourteenth transistors T1 and T14, respectively, are turned on, and the first clock signal of a logic low state applied to the first clock terminal CK is thereby outputted through the carry terminal CR and the output terminal OUT of the current single stage. Since a voltage at the second node J2 and the first clock signal are at a low voltage level, the gate signal Gout and the carry signal Cout output through the output terminal OUT and the carry terminal CR, respectively, are at a low voltage level. Further, the third capacitor C3 is charged to a voltage substantially corresponding to a difference between the high voltage and the low voltage. So the signal of the first node J1 is in a logic high level in FIG. 4.

At this time, since the clock signal applied to the first clock signal CK of the current single stage and the gate signal Gout of the subsequent adjacent single stage are at a logic low state, the second node J2 remains at the logic low state, and the tenth, ninth, twelfth, thirteenth, eighth, and second transistors T10, T9, T12, T13, T8, and T2, respectively, are turned off.

When the carry signal Cout applied to the set terminal S is in a logic low state and the second clock signal CKVB1 applied to the second clock terminal CKB is in a logic low state, the eleventh and fifth transistors T11 and T5, respectively, are turned off. At substantially the same time, the first clock signal CKV1 applied to the first clock terminal CK of the current single stage is in a logic high state, and an output voltage of the first transistor T1 and a voltage of the second node J2 therefore transition to the high voltage. Although the high voltage is applied to the gate of the tenth transistor T10, the electric potential difference between the gate and source of the tenth transistor T10 is substantially zero because the source of the tenth transistor T10 connected to the second node J2 is at the high voltage. As a result, the tenth transistor T10 remains in a turned-off state. Accordingly, the first node J1 is in a floating state and an electric potential of the first node J1 increases to substantially the high voltage charged to the third capacitor C3 due to boosting effect. So the signal of the first node of J1 becomes higher due to the boosted level in FIG. 4.

The clock signal applied to the first clock terminal CK of the current single stage and the second node J2 have the high voltage, and the twelfth, thirteenth and eighth transistors T12, T13, and T8, respectively, are thereby turned on. Further, since the twelfth transistor T12 and the thirteenth transistor T13 are connected in series with each other between the high voltage and the low voltage, e.g., between the first clock terminal CK and the gate voltage terminal Vin of the current single stage, the third node J3 is at an electric potential substantially corresponding to a voltage value substantially equal to a value determined by turn-on resistance values of the twelfth and thirteenth transistors T12 and T13, respectively, e.g., a value voltage-divided between the twelfth and thirteenth transistors T12 and T13, respectively. In an exemplary embodiment, a turn-on resistance value of the thirteenth transistor T13 is about ten thousand times greater than a turn-on resistance value of the twelfth transistor T12, and the voltage value of third node J3 is therefore substantially equal to the high voltage. Thus, the seventh transistor T7 is turned on. Since the seventh transistor T7 is connected in electrical series with the eighth transistor T8 through the fourth node J4, the fourth node J4 has an electric potential substantially corresponding to a voltage value voltage-divided by turn-on resistance values of the seventh and eighth transistors T7 and T8, respectively. In an exemplary embodiment, the turn-on resistance values of the seventh and eight transistors T7 and T8 are substantially the same value, and the fourth node J4 therefore has an electric potential corresponding to an intermediate voltage value substantially between the high voltage and the low voltage. As a result, the third transistor T3 is maintained in a turned off state. Thus, the gate signal Gout of a subsequent single stage, applied through the reset terminal R of the current single stage, is at a logic low level, and the ninth and second transistors T9 and T2, respectively, are maintained in a turned off state. Accordingly, the gate signal Gout and the carry signal Cout having the high voltage are output through the output terminal OUT and the carry terminal CR, respectively, of the current single stage. So a high level voltage is applied to the gate line in FIG. 4.

The first capacitor C1 is charged to a voltage substantially corresponding to an electric potential difference between the third node J3 and the fifth node J5, while the second capacitor C2 is charged to a voltage substantially corresponding to an electric potential difference between the fourth node J4 and the fifth node J5. Further, a voltage at the third node J3 is lower than a voltage at the fifth node J5, since the clock signal applied to the first clock terminal CK, e.g., to the fifth node J5, of the current single stage is at a logic high level.

When the gate signal Gout of the subsequent single stage and the first clock signal applied to the first clock terminal CK maintain a logic high level and the clock signal applied to the second clock terminal CKB of the current single stage maintains a logic low level, the second transistor is turned on, thereby applying the low voltage to the second node J2. The eleventh and fifth transistor T11 and T5 are turned off because of low level of the second clock signal. The tenth transistor T10 is turned on, thereby first node J1 is at a low level. The first and fourteenth transistors T1, T14 are turned off. The gate signal Gout and the carry signal Cout are at a low level voltage. The gate line connected to the gate signal Gout is at a low level voltage. So a low level voltage is applied to the gate line in FIG. 4. In addition, each clock signal maintains a same logic level through 2 horizontal periods although a difference of a rising time of the first clock signal CKV1 and the third clock signal CKV2 is 1 horizontal period.

The driving configuration in subsequent single stages is the same as the current single stage. The said single stage receives first clock signal CKV1 and second clock signal CKVB1, but even-numbered single stages receive third clock signal CKV2 and fourth clock signal CKVB2.

As described herein, in an LCD display apparatus according to an exemplary embodiment of the present invention, power consumption is substantially effectively reduced. Further, a pixel is precharged in the LCD display apparatus according to an exemplary embodiment, thereby reducing a charging time of the sub-pixel and improving a response time of the LCD display apparatus. In addition, a gate driver is directly disposed on a display panel, thereby improving a manufacturing efficiency of the LCD display apparatus.

The present invention should not be construed as being limited to the exemplary embodiments set forth herein. Rather, these exemplary embodiments are provided so that this disclosure will be thorough and complete and will fully convey the concept of the present invention to those skilled in the art.

What is claimed is:

1. A display apparatus comprising:

a panel part comprising:

a plurality of gate lines, a plurality of data lines, and a plurality of pixels, each pixel of the plurality of pixels being connected to a gate line of the plurality of gate lines and being connected to a data line of the plurality of data lines;

a data driver which receives image data and outputs at least a data signal to the plurality of data lines; and a gate driver part disposed on the panel part, the gate driver part receiving a plurality of clock signals and applying a plurality of gate signals to the plurality of gate lines, the gate driver part including at least a first stage and a second stage, the first stage receiving a first clock signal having a first initial rising edge and a second clock signal having a second initial rising edge received after the first rising edge, the second stage receiving a third clock signal having a third initial rising edge received after the first rising edge and a fourth clock signal having a fourth initial rising edge received after the third rising edge, the first stage outputting a first gate signal, the second stage outputting a second gate signal, the first stage, which receives the first clock signal and the second clock signal, receiving the second gate signal from the second stage, which receives the third clock signal and the fourth clock signal, wherein a phase difference between the first rising edge and the third rising edge received after the first rising edge is 90 degrees, and wherein a phase difference of the second rising edge and the fourth rising edge received after the second rising edge is 90 degrees, wherein the first stage and the second stage are connected to each other in sequence, and wherein the first stage receives a scanning start signal.

2. The display apparatus of claim 1, wherein a frequency of the plurality of clock signals is smaller than a frequency of the plurality of gate signals.

3. The display apparatus of claim 1, wherein a frequency of the plurality of clock signals is half a frequency of the plurality of gate signals.

4. The display apparatus of claim 1, wherein the gate driver part comprises a plurality of stages, each stage of the plurality of stages being connected to a corresponding gate line of the plurality of gate lines, the plurality of stages are divided into odd-numbered stages and even-numbered stages, the plurality of gate lines are divided into odd-numbered gate lines and even-numbered gate lines, the first stage is a first odd-numbered stage of the odd-numbered stages and the second stage is a first even-numbered stage of the even-numbered stages, an odd-numbered stage of the odd-numbered stages applies a gate signal to an odd-numbered gate line of the odd-numbered gate lines, and an even-numbered stage of the even-numbered stages applies another gate signal to an even-numbered gate line of the even-numbered gate lines.

5. The display apparatus of claim 4, wherein each of the odd-numbered stages receives the first clock signal and the second clock signal, and each of the even-numbered stages receives the third clock signal and the fourth clock signal.

6. The display apparatus of claim 1, wherein a polarity of the data signal is inverted for each consecutive frame and each consecutive row.

7. The display apparatus of claim 1, wherein a phase difference between the first rising edge and the second rising edge is about 180 degrees, and a phase difference between the third rising edge and the fourth rising edge is about 180 degrees.

8. The display apparatus of claim 1, wherein periods of the first clock signal, the second clock signal, the third clock signal, and the fourth clock signal are substantially equal.

9. The display apparatus of claim 1, wherein amplitudes of the first clock signal, the second clock signal, the third clock signal, and the fourth clock signal are substantially equal.

10. The display apparatus of claim 1, further comprising:

a timing controller which receives the image data from outside and outputs the image data to the data driver; and a gray-scale voltage generator which provides a gray-scale voltage to the data driver to generate the data signal.

11. The display apparatus of claim 1, wherein periods of the plurality of clock signals are different from periods of the plurality of gate signals.

12. The display apparatus of claim 1, wherein the second stage, which receives the third clock signal and the fourth clock signal, receives a carry output from the first stage, which receives the first clock signal and the second clock signal.

13. The display apparatus of claim 1, wherein the second stage provides the second gate signal to reset the first gate signal.

14. The display apparatus of claim 1, wherein the first clock signal maintains a logic level for a first horizontal period and a second horizontal period, and the first gate signal maintains the logic level for the first horizontal period.

15. The display apparatus of claim 14, wherein the second gate signal maintains the logic level for the second horizontal period.

16. The display apparatus of claim 1, wherein the gate driver part further includes at least a third stage, the third stage receiving the first clock signal and the second clock signal, the third stage outputting a third gate signal to the second stage, which receives the third clock signal and the fourth clock signal, for resetting the second gate signal.

17. The display apparatus of claim 16, wherein the third stage receives a carry output from the second stage.

18. The display apparatus of claim 1, wherein the first clock signal and the second clock signal are supplied in a first direction to the first stage, and the third clock signal and the fourth clock signal are supplied in the first direction to the second stage.

19. The display apparatus of claim 1, wherein a period length of the scanning start signal is half a period length of the first clock signal.

20. A method of driving a display apparatus comprising;

supplying, using a gate driver, at least a gate-on signal to a plurality of gate lines, the gate driver including at least a first stage and a second stage, the plurality of gate lines including at least a first gate line and a second gate line, the first stage and the second stage being connected to each other in sequence;

providing a scanning start signal from a timing controller to the first stage but not from the timing controller to the second stage;

providing a first clock signal having a first initial rising edge and a second clock signal having a second initial rising edge received after the first rising edge;

providing a first gate signal from the first stage to the first gate line;

providing a third clock signal having a third initial rising edge received after the first rising edge and a fourth clock signal having a fourth initial rising edge received after the third rising edge;

providing a second gate signal from the second stage to the second gate line;

providing the second gate signal from the second stage, which receives the third clock signal and the fourth clock signal, to the first stage, which receives the first clock signal and the second clock signal, for resetting the first gate signal; and supplying at least a data signal to a plurality of data lines, wherein a phase difference between the first rising edge and the third rising edge received after the first rising edge is 90 degrees, and wherein a phase difference of the second rising edge and the fourth rising edge received after the second rising edge is 90 degrees.

21. The display apparatus of claim 13, wherein a period length of the scanning start signal is half a period length of the first clock signal.

* * * * *